United States Patent
Koposov

(10) Patent No.: US 10,403,798 B2
(45) Date of Patent: Sep. 3, 2019

(54) METHOD FOR FABRICATING QUANTUM DOT LIGHT EMITTING DIODES (LEDS) WITH SUPPRESSED PHOTOBRIGHTING

(71) Applicant: eLux Inc., Vancouver, WA (US)

(72) Inventor: Alexey Koposov, Vancouver, WA (US)

(73) Assignee: eLux, Inc., Vancouver, WA (US)

( * ) Notice: Subject to any disclaimer, the term of this patent is extended or adjusted under 35 U.S.C. 154(b) by 0 days.

(21) Appl. No.: 15/989,431

(22) Filed: May 25, 2018

(65) Prior Publication Data

US 2019/0157517 A1    May 23, 2019

Related U.S. Application Data

(62) Division of application No. 15/817,440, filed on Nov. 20, 2017, now Pat. No. 10,246,638.

(51) Int. Cl.
*H01L 33/50* (2010.01)
*H01L 33/56* (2010.01)
(Continued)

(52) U.S. Cl.
CPC ............ *H01L 33/502* (2013.01); *C09K 11/70* (2013.01); *C09K 11/7492* (2013.01);
(Continued)

(58) Field of Classification Search
CPC ................ H01L 33/502; H01L 33/56; H01L 2933/0041; H01L 2933/005;
(Continued)

(56) References Cited

U.S. PATENT DOCUMENTS 9,666,766 B2    5/2017    Kurtin et al.
2014/0117311 A1    5/2014    Kurtin
(Continued)

FOREIGN PATENT DOCUMENTS

WO    WO-2017034228 A1 *    3/2017    ............ C09K 11/02

OTHER PUBLICATIONS

Steven F. Lee, Mark A. Osborne "Brightening, Blinking, Bluing and Bleaching in the Life of a Quantum Dot: Friend or Foe?", ChemPhysChem 10(13):2174-91.

*Primary Examiner* — Tong-Ho Kim
(74) *Attorney, Agent, or Firm* — Law Office of Gerald Maliszewski; Gerald Maliszewski

(57) ABSTRACT

A device and associated method are provided for a light emitting diode device (LED) with suppressed quantum dot (QD) photobrightening. The QD surfaces, with a maximum cross-sectional dimension of 10 nanometers, are treated with a solution including a multi-valent cation salt. In response to heating the solution, multi-valent cations become attached to the surface of the QD nanocrystals, forming treated QDs that are deposited overlying a top surface of an LED. The LED device emits a non-varying intensity of first wavelength light in the visible spectrum from the treated QDs, when subjected to a continuous exposure of a second wavelength of LED light having an intensity of greater than 50 watts per square centimeter. For example, blue, green, or red color light may be emitted when exposed to LED light in the ultraviolet (UV) spectrum, or a green or red color light when exposed to a blue color LED light.

23 Claims, 4 Drawing Sheets

(51) Int. Cl.
*C09K 11/88* (2006.01)
*C09K 11/74* (2006.01)
*C09K 11/70* (2006.01)
*B82Y 20/00* (2011.01)
*B82Y 40/00* (2011.01)

(52) U.S. Cl.
CPC .......... *C09K 11/883* (2013.01); *H01L 33/504* (2013.01); *H01L 33/56* (2013.01); *B82Y 20/00* (2013.01); *B82Y 40/00* (2013.01); *H01L 2933/005* (2013.01); *H01L 2933/0033* (2013.01); *H01L 2933/0041* (2013.01); *H01L 2933/0083* (2013.01); *Y10S 977/774* (2013.01); *Y10S 977/813* (2013.01); *Y10S 977/816* (2013.01); *Y10S 977/818* (2013.01); *Y10S 977/819* (2013.01); *Y10S 977/824* (2013.01); *Y10S 977/892* (2013.01); *Y10S 977/90* (2013.01); *Y10S 977/95* (2013.01)

(58) Field of Classification Search
CPC . H01L 2933/0083; B82Y 20/00; B82Y 40/00; Y10S 977/774; Y10S 977/813; Y10S 977/816; Y10S 977/818; Y10S 977/819; Y10S 977/824; Y10S 977/892; Y10S 977/90; Y10S 977/95
USPC .......................................................... 438/27
See application file for complete search history.

(56) References Cited

U.S. PATENT DOCUMENTS

| | | | |
|---|---|---|---|
| 2015/0021521 A1* | 1/2015 | Nick | C09K 11/02 252/301.36 |
| 2015/0098212 A1* | 4/2015 | Won | G02F 1/133615 362/97.3 |
| 2017/0125650 A1* | 5/2017 | Pickett | G02B 6/0073 |
| 2017/0211756 A1* | 7/2017 | Koole | C09K 11/02 |

* cited by examiner

METHOD FOR FABRICATING QUANTUM DOT LIGHT EMITTING DIODES (LEDS) WITH SUPPRESSED PHOTOBRIGHTING

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to quantum dot (QD) emissions and, more particularly, to a QD light emitting diode (LED) with suppressed photobrightening.

2. Description of the Related Art

Quantum dots (QDs), or semiconducting nanocrystals are chemical objects with a size falling between cluster molecules (aggregates of $5\text{-}10^5$ atomic or molecular units) and bulk materials (nanometers (nm) to meters (m)). Since first being fabricated through molecular beam epitaxy, QDs have evoked interest as their band gap was found to be tunable with the size of the structure. Decades later, a solution-based approach for fabrication of QDs through colloidal chemistry brought significant attention to these materials. Colloidal syntheses allowed for the preparation of a material of any size and varied chemical composition, with almost any optical band gap. Further, the solution-based approach proved to a feasible route to scale up the preparation of QDs in commercially significant amounts. The control of the optical band gap led to the tunability of optical properties, such as emission and absorbance. Such tunability of physical properties ultimately dictated the potential application of the QD materials, as the tunability of absorbance spectrum was found to be useful for solar cell applications, while the tunability of emission properties allowed these materials to be utilized in the generation of light at specific wavelengths for display and lighting applications.

Currently, there are two major strategies for incorporating QDs in light emitting devices. The first strategy uses direct emitting LEDs, where charges are directly injected into QDs through the LED structure, leading to radiative recombination. In the second strategy, QDs are utilized as color conversion materials, as explained in more detail below.

FIGS. 1A and 1B depict LEDs utilizing different color conversion techniques (prior art). FIG. 1A depicts a remote conversion technique where the QDs are embedded in a film 100 and irradiated by blue or ultraviolet (UV) LED 102, and where the LED is physically separated from the color converter. As shown, light is delivered to the color conversion film via a waveguide 104 and reflector 106. FIG. 1B depicts the second type of color conversion, where the QD embedded film 100 is placed directly on LED 102, with or without a spacer (not shown).

The "directly on LED" approach of FIG. 1B permits the fabrication of more efficient emitting devices that require substantially less QD material. However, despite these benefits, this approach has several technological challenges. These challenges include: high operating temperatures (often above 100° C.) due to proximity to the light emitting LED, high photon flux, and the tight packing of the QD materials due to miniaturization. These factors generally lead to emission quenching through different mechanisms, which reduces conversion efficiency. Much of the research in this field is aimed at addressing quenching mechanisms and determining pathways to minimize the impact of such factors. Generally, the strategies of coating the QD cores with large (also known as "giant" (5-10 nm) shell or multiple shells are utilized for the improvement of the emission properties and eliminating of emission quenching mechanisms. However, other factors are present that often affect the emissive properties of QDs exposed to direct LED emissions. One such issue is photobrightening—a process where QD emission increases under the conditions of a high steady state (constant) photon flux. While it might be initially assumed that the photobrightening effect would be beneficial due to the increased brightness of the emissive device, such changes in the emissive properties are often unacceptable in commercial products because they disrupt the color gamut of a display and change the color temperature of the lighting system.

At the time of this writing, the physical mechanisms underlying photobrightening are poorly understood and are not well addressed in the scientific literature. However, the effect of photobrightening cannot be neglected in the fabrication of practical emissive devices. The majority of the published photobrightening research covers short-term pulsed irradiation (with a range of pulse times), which is not directly applicable to LED applications where the QDs are subjected to 50-500 W/cm² continuous light for extended periods of time (i.e., hours of illumination). With the directly on LED configuration, such as shown in FIG. 1B, the integrated emission intensity of quantum dots may increase as much as 20-30% over the course of 60 minutes of operation. Moreover, the photobrightening effect may well be size dependent, which is rather common for nanostructured materials. For example, more pronounced photobrightening may occur for smaller nanoparticles. While being easier to make, the smaller nanoparticles (core or single shell particles) are not utilized for color converting applications as they are also sensitive to various degradation/decomposition and emission quenching effects. As mentioned above, the growth of multi-shell structures or "giant" shell growth is utilized to suppress these effects, often making particles of the size greater than 10 nm. Further, photobrightening may be present for nanop articles emissions in both the visible, and outside the visible ranges of the electromagnetic spectrum. Within the context of display and lighting applications, the visible range is of particular interest, where the QD material systems are typically cadmium and zinc chalcogenides (as well as their alloys), ternary chalcogenides (e.g., copper indium sulfide and similar materials), and indium phosphide.

FIG. 2 is a graph depicting changes in LED emission intensity as a result of photobrightening. Curve 200 represents the initial emission of a directly on LED QD device after thermal equilibration. Curve 202 represents the emission after 1 hour of the LED operating at full power. Generally, the photobrightening effect may be small for larger (red-emitting) nanoparticles, while for green (and potentially blue) emitters, the photobrightening effect is more pronounced. That is, the color emitted by a QD is dependent upon the particle size and particle composition. Green and blue emitting QDs may be smaller than red emitters due to a dependence between size and band gap, and as such, blue and green QDs are typically more susceptible to the photobrightening effect. Since the human eye is most sensitive to the color green, changes in green emission intensity are the most critical in the design of the color gamut and color temperature for display and lighting application.

Currently, the QDs utilized for directly on LED color conversion (FIG. 1B) usually utilize a multi-shell structure, where several shells of different semiconducting materials are grown around the core, or "giant" structure, where the thickness of the shell is comparable with the QD size (up to 5 nm). These materials, while often less prone to photobrightening, generally require multi-step preparation procedures at elevated temperatures, which makes these materials less competitive due to high manufacturing costs. Further, photobrightening is not addressed in the "giant"/multi-shell technical literature, which is most likely due to the structural complexity of these types of QDs.

It would be advantageous if the effect of QD photobrightening could be suppressed without forming multiple layers of shell material, or without forming a "giant" shell that is a thick as the core particle.

SUMMARY OF THE INVENTION

Disclosed herein is a method of modifying quantum dots (QDs) to suppress the effect of photobrightening for "directly on light emitting diode (LED)" applications, when the QDs are subjected to constant high photon flux. In one aspect, the surface of the quantum dots is modified through exposure to divalent cation salts to replace some of the surface atoms and/or block the pre-existing surface sites that may contribute to the photobrightening effect. Such "surface doping" results in almost complete suppression of photobrightening. In one example provided below, the changes of emission intensity over 80 minutes of constant LED operation were diminished from 18-19% to 5%.

Accordingly, methods are provided for quantum dot photobrightening suppression and for forming a light emitting diode device with suppressed quantum dot photobrightening. The methods provide QD nanocrystals having a surface, with a maximum cross-sectional dimension of 10 nanometers (nm), capable of emissions in the visible spectrum of light. The QD nanocrystal surfaces are treated with a solution including a multi-valent cation salt, with the solution being heated to a temperature in the range of 50 to 200 degrees C. In response to heating the solution, multi-valent cations become attached to the surface of the quantum dot nanocrystals, forming treated QDs with suppressed photobrightening. In one aspect, the multi-valent cations become attached to the QD nanocrystal surfaces through solution-based pseudo-atomic layer deposition.

The treated QDs are deposited overlying a top surface of a light emitting diode (LED). The result is an LED device capable of emitting a non-varying intensity of a first wavelength light in the visible spectrum from the treated QDs, when subjected to a continuous exposure of a second wavelength of LED light having an intensity of greater than 50 watts per square centimeter (W/cm$^2$). In one aspect, the treated QDs are mixed with an epoxy, silicon, or acrylate based polymer matrix materials to form a matrix paste, and the matrix paste is deposited on the LED.

For example, the LED device may include treated QDs emitting a non-varying intensity of blue, green, or red color light when exposed to LED light in the ultraviolet (UV) spectrum. In another example, the LED device may include the treated QDs emitting a non-varying intensity of green or red color light when exposed to a blue color LED light.

Typically, the QD nanocrystals have either a solitary core or core-single shell structure. In the case of a solitary core, the core surface is the QD nanocrystal surface. In the case of a core-single shell structure, the shell comprises the QD nanocrystal surface. The interface between the core and shell may, or may not be alloyed. If QD nanocrystal surface is a binary or binary alloyed material, then the QD nanocrystals are treated with a solution including divalent cation salts. For example, the QD nanocrystal surface may be: CdS, CdSe, CdTe, GaAs, InAs, InN, InP, ZnS, ZnSe, ZnTe, or combinations thereof. If the QD nanocrystal surface is a tertiary or tertiary alloyed material, the QD nanocrystals are treated with trivalent cation salts, divalent cation salts, monovalent cation salts, or combinations thereof. For example, the QD nanocrystal surface may be: ZnSSe, ZnSeTe, ZnSTe, CdSSe, CdSeTe, CdSTe, ZnCdS, ZnCdSe, ZnCdTe, ZnCdSSe, ZnCdSeTe, InGaAs, GaAlAs, InGaN, CuInS$_2$, CuGaS$_2$, Cu(In,Ga)Se$_2$, Cu(Zn,Sn)Se$_2$, Cu(Zn,Sn)S$_2$, CuIn(Se,S)$_2$, CuZn(Se,S)$_2$, CuSn(Se,S)$_2$, Cu(Zn,Sn)(Se,S)$_2$, or combinations thereof.

In one aspect, the QD nanocrystal surface is a Type III-V semiconductor QD, and the QD nanocrystal surfaces are treated with a solution including trivalent cation salts, divalent cation salts, or combinations thereof. The trivalent cation salts may be comprised of Al, Ga, In, Fe, Sb, or Bi.

Additional details of the above-described methods, treated quantum dots with suppressed photobrightening, and an associated LED device are provided below.

DETAILED DESCRIPTION

Figure 1A:
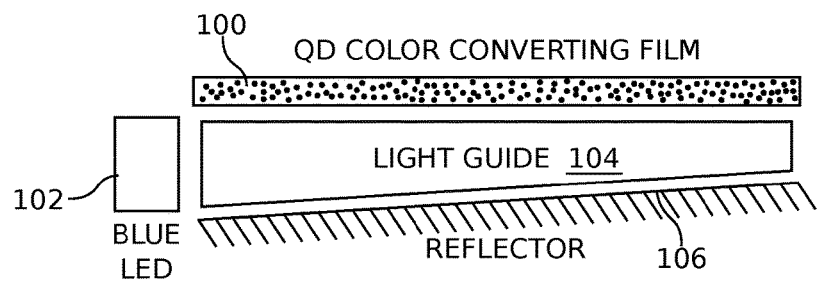
FIGS. 1A and 1B depict LEDs utilizing different color conversion techniques (prior art).
Figure 1B:
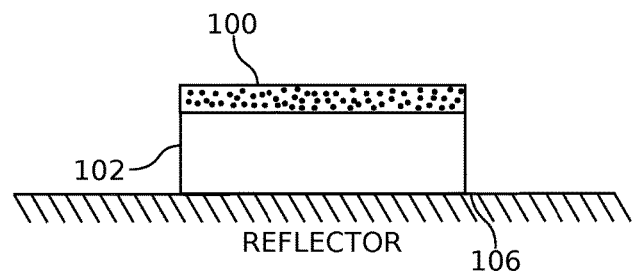
Figure 2:
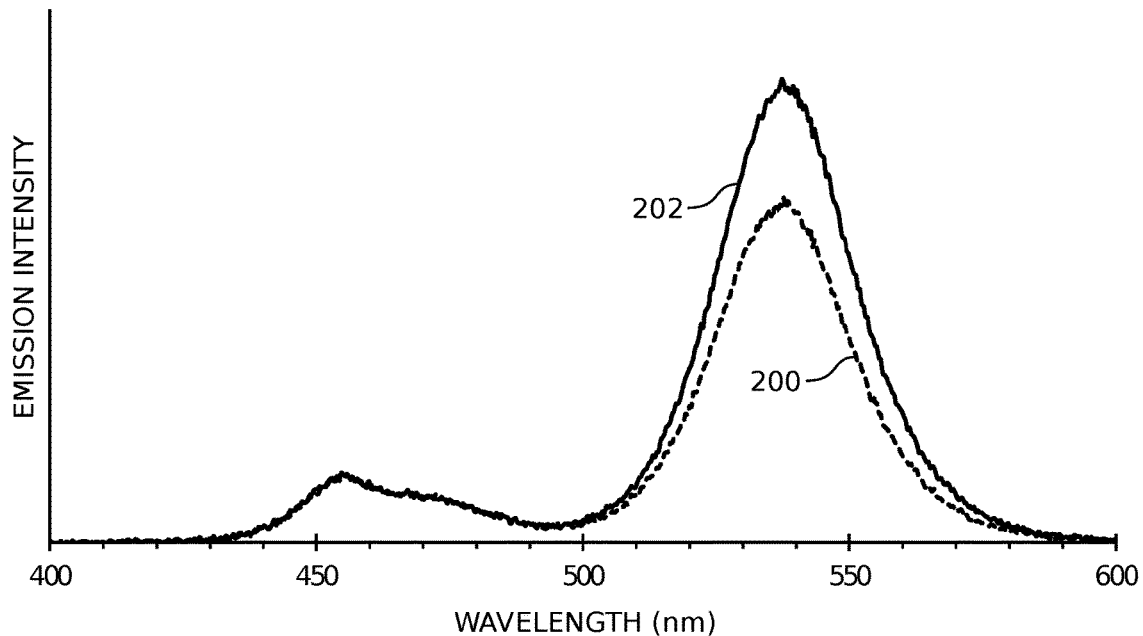
FIG. 2 is a graph depicting changes in LED emission intensity as a result of photobrightening.
Figure 3A:
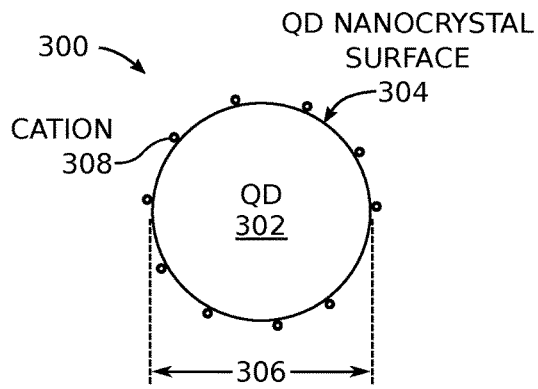
FIGS. 3A and 3B are partial cross-sectional views depicting treated quantum dots (QDs) with suppressed photobrightening.
Figure 3B:
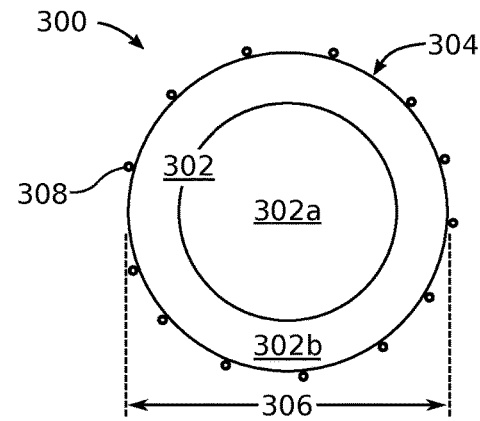

FIGS. 3A and 3B are partial cross-sectional views depicting treated quantum dots (QDs) with suppressed photobrightening. The treated QD 300 comprises a QD nanocrystal 302 having a surface 304 with a maximum cross-sectional dimension 306 of 10 nanometers (nm), capable of emissions in the visible spectrum of light. The size of the QD nanostructures is mentioned as a means of distinguishing these QDs from larger sized QDs made from multiple shells, or "giant" QDs formed from one extremely thick shell. Cations 308 are attached to the surface 304 of the QD nanocrystal 302. A cation is a positively charged ion (atom).

A typical cation has a radius of less than $0.8 \times 10^{-10}$ meters. The treated QD 300 emits a non-varying intensity of first wavelength of light in the visible spectrum when subjected to a continuous exposure of a second wavelength of light having an intensity of greater than 50 watts per square centimeter ($W/cm^2$). The exact intensity limits are dependent upon the QD material and the wavelength of the light to which the QDs are exposed. In one aspect, the treated quantum dots 300 emit a blue, green, or red color light when exposed to light in the ultraviolet (UV) spectrum. In another aspect, the treated quantum dots emit a green or red color light when exposed to a blue color light. As used herein, a non-varying intensity of light is defined as a change of 5% or less.

As shown in FIG. 3A, the QD nanocrystal 302 may have the structure of a solitary core, or as shown in FIG. 3B, the QD nanocrystal 302 may have a core-single shell structure. That is, the combination of core 302a and shell 302b comprise QD nanocrystal 302. In the case of the core-single shell structure, the QD nanocrystal surface 304 is the surface of the shell. In some aspects not explicitly shown, the structure of the treated quantum dot 300 may have more than one shell comprised of different materials. In another aspect not shown, the core 302a and shell 302b may be anisotropic with the aspect ratio in the range of 1-2, in which case the core is not spherical. Although generally depicted as spherical, the treated QD and QD nanocrystal core are not limited to any particular shape. In another aspect not shown, an alloy may be formed between the core and shell and (or) between the shells.

If the QD nanocrystal surface 304 is a binary or binary alloyed material, then the cations 308 are divalent cations. Some examples of divalent cations include Zn, Cd, Hg, and Pb. However, the treated QDs are not limited to any particular divalent cation. A divalent cation has a charge of +2. Binary refers to a material or molecule comprised of two elements. Binary alloyed refers to an alloy of two or more binary materials. Generally, alloys are understood to be a mixture of a metal with another element. For example, the QD nanocrystal surface 304 may be: CdS, CdSe, CdTe, GaAs, InAs, InN, InP, ZnS, ZnSe, ZnTe, or combinations thereof. However, the QD surfaces are not necessary limited to these examples of binary or binary alloyed materials.

If the QD nanocrystal surface 304 is a tertiary or tertiary alloyed material, the cations 308 may be trivalent cations, divalent cations, monovalent cations, or combinations thereof. A trivalent cation has a charge of +3 and a monovalent cation has a charge of +1. Trinary refers to a material or molecule comprised of three elements, and trinary alloyed refers to an alloy of two or more trinary materials. For example, the QD nanocrystal surface 304 may be: ZnSSe, ZnSeTe, ZnSTe, CdSSe, CdSeTe, CdSTe, ZnCdS, ZnCdSe, ZnCdTe, ZnCdSSe, ZnCdSeTe, InGaAs, GaAlAs, InGaN, $CuInS_2$, $CuGaS_2$, $Cu(In,Ga)Se_2$, $Cu(Zn,Sn)Se_2$, $Cu(Zn,Sn)S_2$, $CuIn(Se,S)_2$, $CuZn(Se,S)_2$, $CuSn(Se,S)_2$, $Cu(Zn,Sn)(Se,S)_2$, or combinations thereof. However, the QD surfaces are not necessary limited to these examples of trinary or trinary alloyed materials.

In one aspect, the QD nanocrystal surface 304 is a Type III-V semiconductor QD, and the cations 308 may be trivalent cations, divalent cations, or a combination of both. The trivalent cations may, for example, be Al, Ga, In, Fe, Sb, or Bi. Other trivalent cations, besides the ones listed above, may also be used. Alternatively, photobrightening might be suppressed with treatments with chalcodenide precursors, however, as it is known from the literature, the enrichment of the QD surface with chalcogen atoms may negatively affect the emission properties of QDs. It should also be noted that the cations in salts used to treat the QD surfaces need not necessary be the same metal making up the QD nanocrystal surface material.

Figure 4:
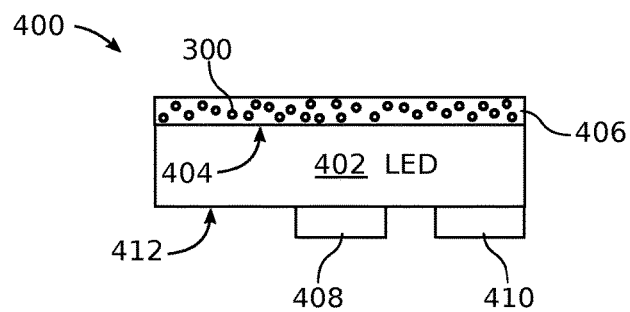
FIG. 4 is a partial cross-sectional view depicting an exemplary QD light emitting diode (LED) device with suppressed photobrightening.

FIG. 4 is a partial cross-sectional view depicting an exemplary QD light emitting diode (LED) device with suppressed photobrightening. The device 400 comprises an LED 402 with a top surface 404. A plurality of treated QDs 300 with suppressed photobrightening overlies the LED top surface 404. As explained above, each treated QD comprises a QD nanocrystal, capable of emissions in the visible spectrum of light, and having a surface with a maximum cross-sectional dimension of 10 nm. Cations are attached to the surface of the QD nanocrystals (see FIGS. 3A and 3B). Details of the treated QDs 300 have been presented above and are not repeated here in the interest of brevity.

The device 400 emits a non-varying intensity of first wavelength of light from the treated QDs 300 in the visible spectrum when subjected to a continuous exposure of a second wavelength of LED light having an intensity of greater than 50 $W/cm^2$. In one aspect, the device 400 emits a blue, green, or red color light from the treated QDs when exposed to LED light in the UV spectrum. In another aspect, the device 400 emits a green or red color light from the treated QDs when exposed to a blue color LED light.

In one aspect as shown, an epoxy, silicon, or acrylate based polymer matrix material 406 overlies the top surface of the LED, and the treated QDs 300 are embedded in the matrix material. Alternatively but not shown, the treated QDs may be deposited on the LED top surface without the use of a matrix material. That is, the treated QDs are spatially separated from the LED by a non-emissive material. As shown, electrodes 408 and 410 extend from the LED bottom surface 412, however, the device 400 is not limited to any particular electrical interface configuration or LED shape.

Figure 5:
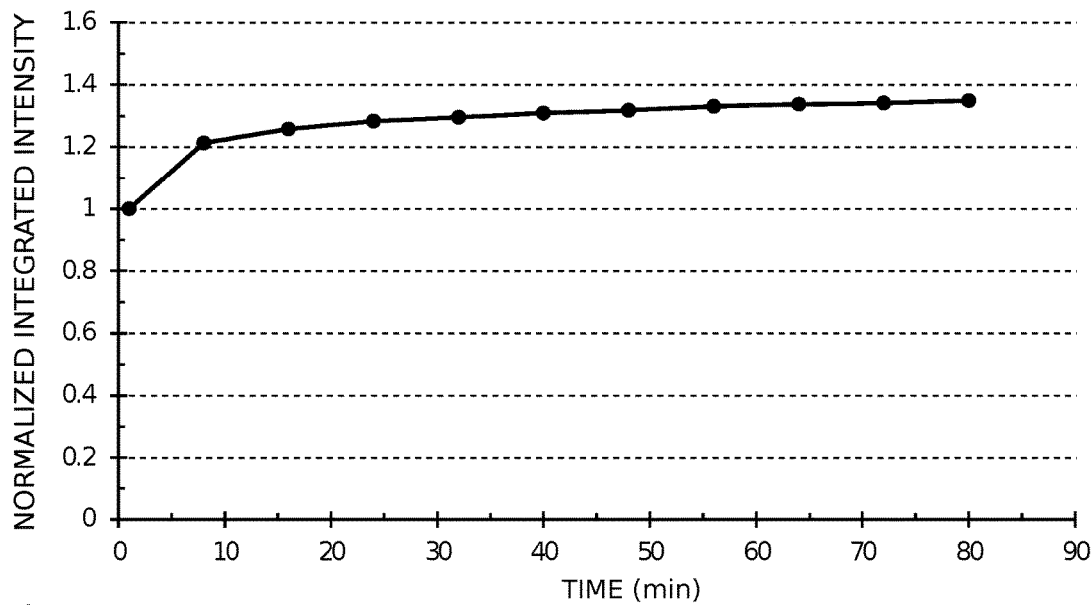
FIG. 5 depicts the evolution of emission intensity upon continuous irradiation as an illustration of the photobrightening effect on the untreated green-emitting QDs placed in a matrix material on top of an LED.

FIG. 5 depicts the evolution of emission intensity upon continuous irradiation as an illustration of the photobrightening effect on the untreated green-emitting QDs placed in a matrix material on top of an LED. When applied directly on an LED or micro LED, green emitting QDs suffer from photobrightening with an extreme example of such effect illustrated in the figure. In this case photobrightening causes an emission growth up to almost 40% as compared to the thermally equilibrated value. The initial point of the measurement (time=0) was recorded after thermal equilibrium in the emitting layer had been achieved to eliminate competing thermal processes.

Figure 6A:
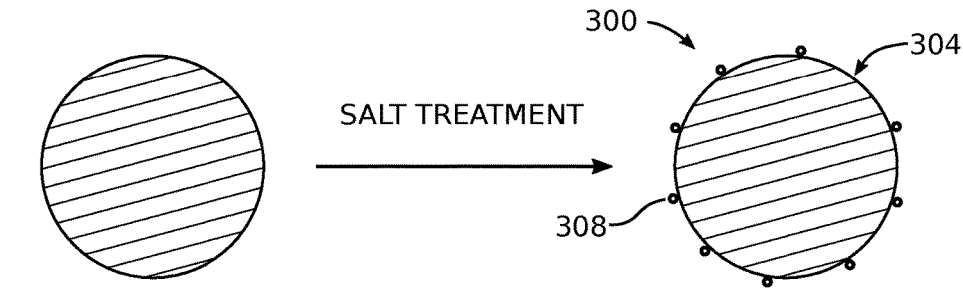
FIGS. 6A and 6B are partial cross-sectional views representing the QD nanocrystal surface treatment.
Figure 6B:
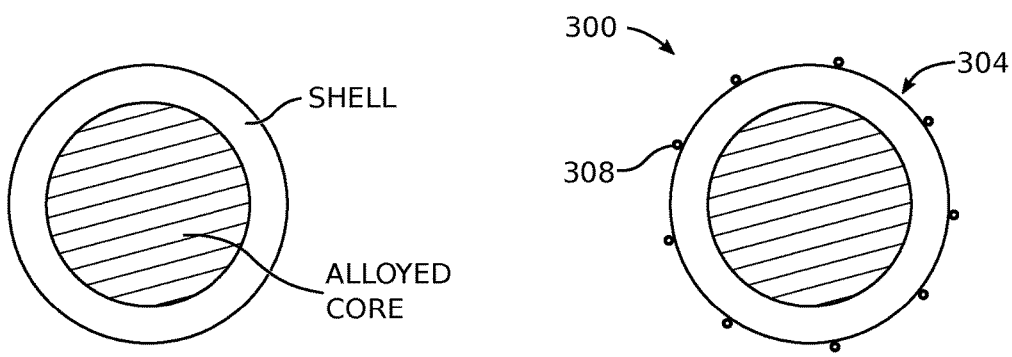

FIGS. 6A and 6B are partial cross-sectional views representing the QD nanocrystal surface treatment (the surface ligands are omitted for clarity). The surface ligands are charged, or neutral molecules chemically attached to the surface of the QD. Such ligands might originate from the colloidal synthesis of the QD nanocrystals or they can be added in subsequent treatments. The ligands are utilized to control the growth of the nanoparticles during synthesis and later they are used to prevent the aggregation of the particles. In one example, the green emitting QD nanocrystals, with a peak emission at about 530 nm, were comprised of alloyed $Cd_xZn_{1-x}Se$ core 302a and a ZnS shell 302b, synthesized through a scalable single-step synthesis of a single shell formed around a core, providing a particle size of around 6 nm. The ability to suppress photobrightening in QD nanocrystals, as described herein, makes the simple one-step synthesis process an advantageous fabrication process, when compared to the several steps required to make the conventional multi-shell or giant shell structures mentioned in the Background Section, above. Further, the ability to suppress photobrightening in solitary core structure QD nanocrystals is even more advantageous.

In order to suppress changes in emission intensity, the green-emitting alloyed QD nanocrystals were treated with zinc oleate in 1-octadecene at elevated temperatures. This treatment was performed to deactivate active sites on the surface of QD nanocrystal, which may participate in photobrightening. Such deactivation is done by pseudo-atomic layer deposition of zinc atoms on the QD nanocrystal surface and/or potential replacement of the poorly attached surface atoms. Atomic layer deposition (ALD) is based on the sequential use of a gas phase chemical process. ALD is considered a subclass of chemical vapor deposition. The majority of ALD reactions use two chemicals, typically called precursors. These precursors react with the surface of a material one at a time in a sequential, self-limiting, manner. Through the repeated exposure to separate precursors, a thin film is slowly deposited. As used herein, pseudo-ALD is a solution-based approach, in contrast to the gas phase approach of ALD. Also in contrast to ALD, pseudo-ALD uses only a single precursor to deposit only one element, not two.

Alternatively, instead of zinc oleate, the QD nanocrystal surface treatment can be performed using any other divalent cations that are capable of attachment to a QD nanocrystal structure. The results of the treatment are schematically represented on the FIGS. 6A and 6B, where spots labeled as 308 represent newly attached cations. This salt treatment may also be understood to be QD nanocrystal "surface" doping, where the doping atom replaces surface imperfections that originate from the single-step synthesis procedure. These imperfections are chemically unstable surface sites.

In one example, the treatment was performed by the addition of QD nanocrystals suspended in toluene into a solution of zinc oleate (200 milligrams (mg)) in 2 milliliters (mL) of 1-octadecene. The mixture was stirred at a temperature within the range of 100-150° C. for 1 hour. Generally, any solvent with high boiling point, capable of dispersing QD nanocrystals and solubilizing a metal salt can be utilized for such modification. Such solvents typically include saturated, non-saturated, branched, cyclic, and aromatic hydrocarbons with boiling point above the reaction temperature. Additionally, amines, esters and ethers with saturated, non-saturated, branched, cyclic or aromatic hydrocarbon moieties can be utilized for such a purpose.

Following the treatment of the QD nanocrystal surfaces, the treated QDs can be purified using well-known procedures by the addition of a non-solvent (generally polar solvents, such as alcohols, ketones, aldehydes, ethers, or esters), and separation of the precipitated treated QDs. The resulting materials can then be incorporated into an LED structure, by redispersion of the treated QDs in a matrix material, such as an epoxy-, silicone-, or acrylate-based polymer. In principle, any polymeric material capable of transmittance of emitted colors can be utilized for such applications. Then, the matrix with treated QDs is coated over an LED and cured.

Figure 7:
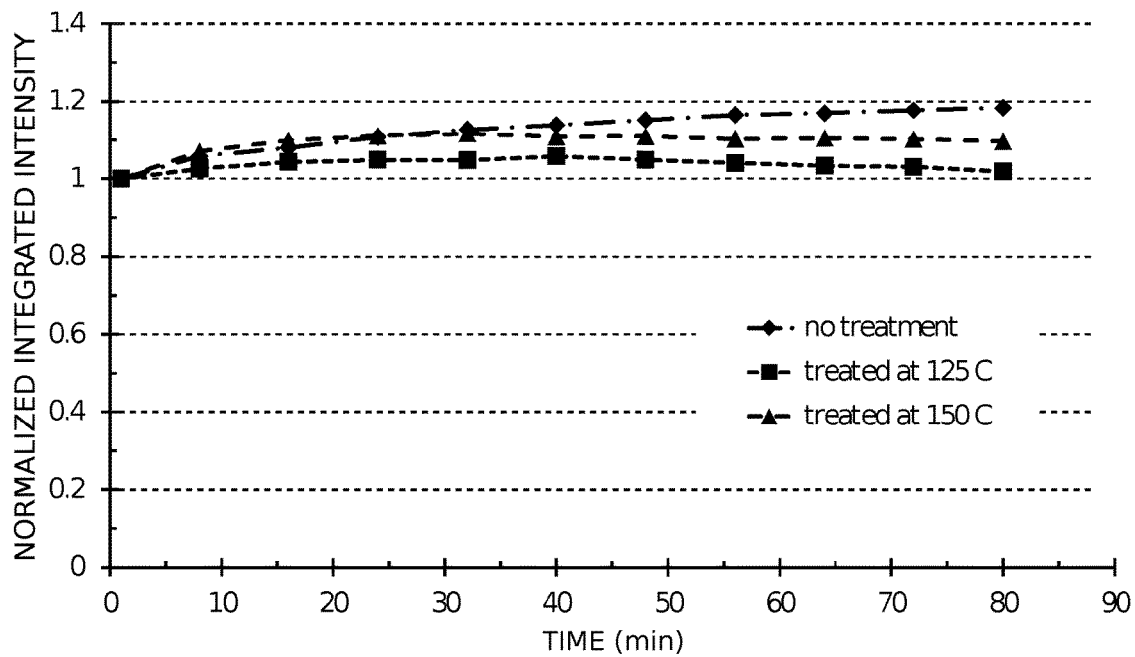
FIG. 7 is a graph depicting the performance of QDs before and after a surface treatment (at two different temperatures) with QDs deposited directly upon a blue light emitting LED.

FIG. 7 is a graph depicting the performance of QDs before and after a surface treatment (at two different temperatures) with QDs deposited directly upon a blue light emitting LED. The QDs had a $Cd_xZn_{1-x}Se$ core and a ZnS shell, a particle size of around 6 nm, and were treated with zinc oleate in 1-octadecene. It can be seen that the treatment substantially suppressed the photobrightening. For untreated QDs the emission increased by 18-19% from the original thermally equilibrated value after 80 minutes of constant illumination at approximately 200 W/cm². The treatment at 150° C. partially suppressed the photobrightening effect leading to an emission growth of approximately 10%. Treatment at a lower temperature, such as 125° C., led to stabilized emission properties and a minimal change of intensity within 5% upon extended irradiation. Instead of zinc, the QD nanocrystal surfaces could have been treated using other divalent cations (e.g., Cd, Hg, or Pb) on the QD nanocrystal surfaces at similar temperatures.

In other aspects, the quantum dots may comprise a core and shell made, respectively, of cadmium and zinc chalcogenides, with a core size of 2-5 nm and a shell thickness of 0-2 nm, and where the 1-100% of the surface atoms are exchanged with cadmium or zinc in such way that it results in suppressed photobrightening.

Figure 8:
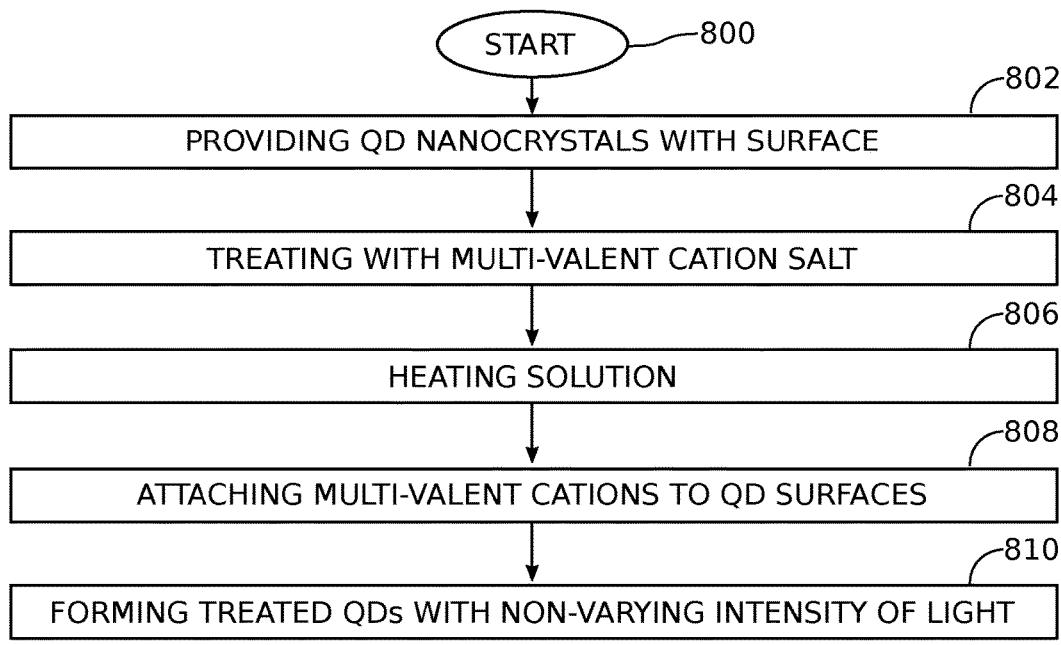
FIG. 8 is a flowchart illustrating a method for suppressing quantum dot photobrightening.

FIG. 8 is a flowchart illustrating a method for suppressing quantum dot photobrightening. Although the method is depicted as a sequence of numbered steps for clarity, the numbering does not necessarily dictate the order of the steps. It should be understood that some of these steps may be skipped, performed in parallel, repeated, or performed without the requirement of maintaining a strict order of sequence. Generally however, the method follows the numeric order of the depicted steps. The method starts at Step 800.

Step 802 provides QD nanocrystals having a surface, with a maximum cross-sectional dimension of 10 nm, capable of emissions in the visible spectrum of light. In Step 804 the QD nanocrystal surfaces are treated with a solution including a multi-valent cation salt. In Step 806 the solution is heated to a temperature in the range of 50 to 200 degrees C. In response to heating the solution, multi-valent cations become attached to the surface of the quantum dot nanocrystals in Step 808, forming treated QDs with suppressed photobrightening. In one aspect, the multi-valent cations become attached to the QD nanocrystal surfaces through pseudo-atomic layer deposition. Step 810 forms treated quantum dots emitting a non-varying intensity of first wavelength of light in the visible spectrum when subjected to a continuous exposure of a second wavelength of light having an intensity of greater than 50 W/cm².

In one aspect, forming the treated quantum dots emitting the non-varying intensity of first wavelength of light in Step 810 includes the treated QDs emitting a blue, green, or red color light when exposed to light in the UV spectrum. In another aspect of Step 810, the treated QDs emit a green or red color light when exposed to a blue color light.

Typically, Step 802 provides QD nanocrystals having either a solitary core or core-single shell structure. In the case of a solitary core, the core surface is the QD nanocrystal surface. In the case of a core-single shell structure, the shell comprises the QD nanocrystal surface. If QD nanocrystal surface is a binary or binary alloyed material, then the QD nanocrystals are treated with a solution including divalent cation salts in Step 804. For example, the QD surface may be: CdS, CdSe, CdTe, GaAs, InAs, InN, InP, ZnS, ZnSe, ZnTe, or combinations thereof. If Step 802 provides QD nanocrystals with a surface that is a tertiary or tertiary alloyed material, Step 804 treats the QD nanocrystals with trivalent cation salts, divalent cation salts, monovalent cation salts, or combinations thereof. For example, the QD surface may be: ZnSSe, ZnSeTe, ZnSTe, CdSSe, CdSeTe, CdSTe, ZnCdS, ZnCdSe, ZnCdTe, ZnCdSSe, ZnCdSeTe, InGaAs, GaAlAs, InGaN, $CuInS_2$, $CuGaS_2$, $Cu(In,Ga)Se_2$, $Cu(Zn,Sn)Se_2$, $Cu(Zn,Sn)S_2$, $CuIn(Se,S)_2$, $CuZn(Se,S)_2$, $CuSn(Se,S)_2$, $Cu(Zn,Sn)(Se,S)_2$, or combinations thereof.

In one aspect, Step 802 provides QD nanocrystals with a surface that is a Type III-V semiconductor, and in Step 804 the QD surfaces are treated with a solution including trivalent cation salts, divalent cation salts, or combinations thereof. The trivalent cation salts may be comprised of Al, Ga, In, Fe, Sb, or Bi.

Figure 9:
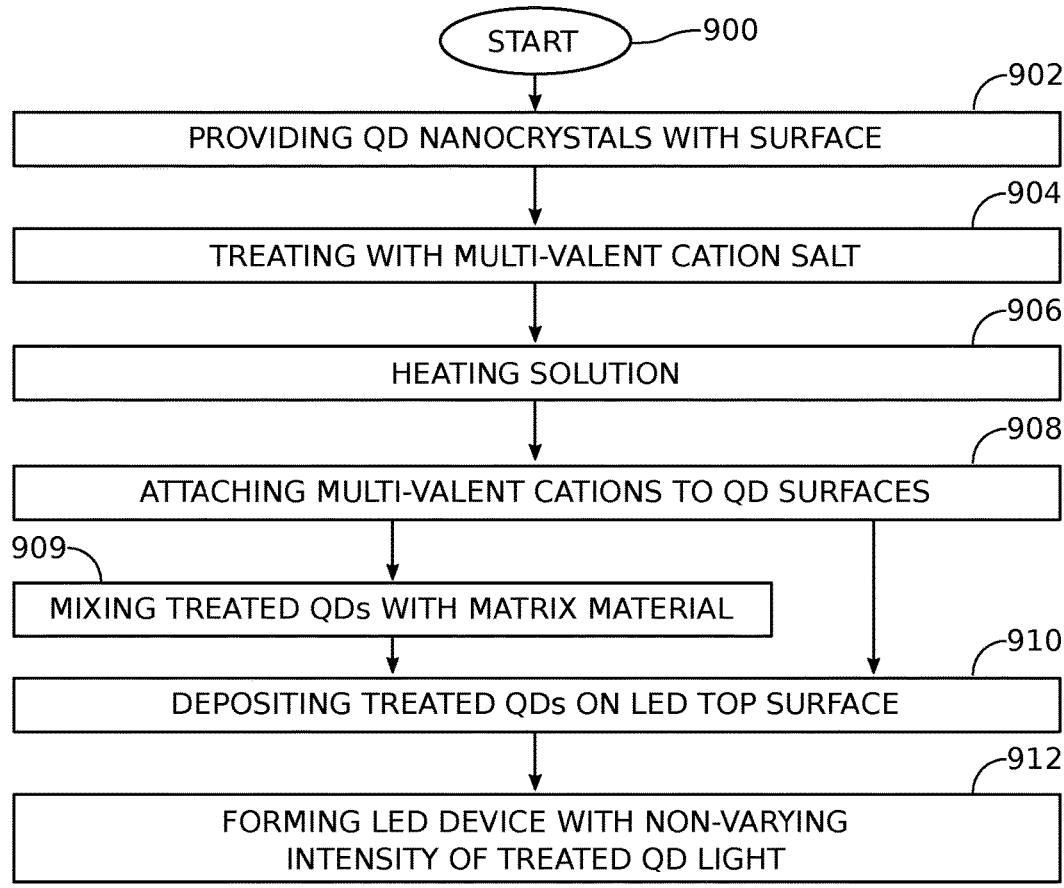
FIG. 9 is a flowchart illustrating a method for forming a light emitting diode device with suppressed quantum dot photobrightening.

FIG. 9 is a flowchart illustrating a method for forming a light emitting diode device with suppressed quantum dot photobrightening. The method starts at Step 900. Step 902 provides QD nanocrystals having a surface, with a maximum cross-sectional dimension of 10 nm, capable of emissions in the visible spectrum of light. In Step 904 the QD nanocrystal surfaces are treated with a solution including a multi-valent cation salt. In Step 906 the solution is heated to a temperature in the range of 50 to 200 degrees C. In response to heating the solution, multi-valent cations become attached to the surface of the quantum dot nanocrystals in Step 908, forming treated QDs with suppressed photobrightening. In one aspect, the multi-valent cations become attached to the QD nanocrystal surfaces through pseudo-atomic layer deposition. In Step 910 the treated QDs are deposited overlying a top surface of an LED. Step 912 provides an LED device capable of emitting a non-varying intensity of a first wavelength light in the visible spectrum from the treated QDs, when subjected to a continuous exposure of a second wavelength of LED light having an intensity of greater than 50 W/cm$^2$. In one aspect, the treated QDs are mixed with an epoxy, silicon, or acrylate based polymer matrix materials in Step 909 to form a matrix paste, and the matrix paste is deposited on the LED in Step 910.

For example, the LED device of Step 912 may include treated QDs emitting a non-varying intensity of blue, green, or red color light when exposed to LED light in the UV spectrum. In another example, the LED device of Step 912 may include the treated QDs emitting a non-varying intensity of green or red color light when exposed to a blue color LED light.

Typically, QD nanocrystals provided in Step 902 have either a solitary core or core-single shell structure. In the case of a solitary core, the core surface is the QD nanocrystal surface. In the case of a core-single shell structure the shell comprises the QD nanocrystal surface. If the QD nanocrystals provided in Step 902 have a surface that is a binary or binary alloyed material, then the QD nanocrystals are treated with a solution including divalent cation salts in Step 904. For example, the QD nanocrystal surface may be: CdS, CdSe, CdTe, GaAs, InAs, InN, InP, ZnS, ZnSe, ZnTe, or combinations thereof. If the QD nanocrystals provided in Step 902 have a surface that is a tertiary or tertiary alloyed material, then in Step 904 the QD nanocrystals are treated with trivalent cation salts, divalent cation salts, monovalent cation salts, or combinations thereof. For example, the QD nanocrystal surface may be: ZnSSe, ZnSeTe, ZnSTe, CdSSe, CdSeTe, CdSTe, ZnCdS, ZnCdSe, ZnCdTe, ZnCdSSe, ZnCdSeTe, InGaAs, GaAlAs, InGaN, CuInS$_2$, CuGaS$_2$, Cu(In,Ga)Se$_2$, Cu(Zn,Sn)Se$_2$, Cu(Zn,Sn)S$_2$, CuIn(Se,S)$_2$, CuZn(Se,S)$_2$, CuSn(Se,S)$_2$, Cu(Zn,Sn)(Se,S)$_2$, or combinations thereof.

In one aspect, the QD nanocrystals provided in Step 902 have a surface that is a Type III-V semiconductor, and in Step 904 the QD nanocrystal surfaces are treated with a solution including trivalent cation salts, divalent cation salts, or combinations thereof. Type III-V semiconductors are a group of binary semiconducting materials, where the cation is selected from Group III of the Periodic Table (e.g., Al, Ga, or In) and the anion is selected from the Group V (e.g., N, P, or As). The cation from Group III is trivalent, therefore the surface treatment may require trivalent cation for the treatment, but divalent cations are also used. The trivalent cation salts may be comprised of Al, Ga, In, Fe, Sb, or Bi.

Treated quantum dots, QD LED devices, and associated fabrication processes have been presented for the suppression of the QD photobrightening effect. Examples of particular hardware configurations and process steps have been used to illustrate the invention. However, the invention is not limited to merely these examples. Other variations and embodiments of the invention will occur to those skilled in the art.

We claim:

1. A method for suppressing quantum dot photobrightening, the method comprising:
    providing quantum dots (QD) nanocrystals having a surface with a maximum cross-sectional dimension of 10 nanometers (nm), capable of emissions with the visible spectrum of light;
    treating the quantum dot nanocrystal surface with a solution including a multi-valent cation salt;
    heating the solution to a temperature in a range of 50 to 200 degrees C.;
    in response to heating the solution, attaching elements to the surface of the quantum dot nanocrystals consisting of cations; and,
    forming treated quantum dots with suppressed photobrightening, capable of emitting a non-varying intensity of first wavelength of light in the visible spectrum when subjected to a continuous exposure of a second wavelength of light having an intensity of greater than 50 watts per square centimeter (W/cm$^2$).

2. The method of claim 1 wherein providing the QD nanocrystals includes providing QD nanocrystals with a structure selected from the group consisting of a solitary core and a core-single shell structure.

3. The method of claim 1 wherein providing the QD nanocrystals includes providing QD nanocrystals comprising a binary or binary alloyed material surface; and,
    wherein treating the QD nanocrystals with the solution includes treating the QD nanocrystal surfaces with a solution including a divalent cation salt.

4. The method of claim 3 wherein the QD nanocrystal surface is selected from the group consisting of CdS, CdSe, CdTe, GaAs, InAs, InN, InP, ZnS, ZnSe, ZnTe, and combinations thereof.

5. The method of claim 1 wherein providing the QD nanocrystals includes providing QD nanocrystals with a tertiary or tertiary alloyed material surface; and,
    wherein treating the QD nanocrystals with the solution includes treating the QD nanocrystal surfaces with a solution including a material selected from the group consisting of trivalent cation salts, divalent cation salts, monovalent cation salts, and combinations thereof.

6. The method of claim 5 wherein the QD nanocrystal surface is selected from the group consisting of ZnSSe, ZnSeTe, ZnSTe, CdSSe, CdSeTe, CdSTe, ZnCdS, ZnCdSe, ZnCdTe, ZnCdSSe, ZnCdSeTe, InGaAs, GaAlAs, InGaN, CuInS$_2$, CuGaS$_2$, Cu(In,Ga)Se$_2$, Cu(Zn,Sn)Se$_2$, Cu(Zn,Sn) S$_2$, CuIn(Se,S)$_2$, CuZn(Se,S)$_2$, CuSn(Se,S)$_2$, Cu(Zn,Sn)(Se, S)$_2$, and combinations thereof.

7. The method of claim 1 wherein providing the QD nanocrystals includes providing QD nanocrystals having a Type III-V semiconductor surface; and,
    wherein treating the QD nanocrystals with the solution includes treating the QD nanocrystal surfaces with a solution including a material selected from the group consisting of trivalent cation salts, divalent cation salts, and combinations thereof.

8. The method of claim 7 wherein the trivalent cation salts include a cation selected from the group consisting of Al, Ga, In, Fe, Sb, and Bi.

9. The method of claim 1 wherein attaching multi-valent cations to the surface of the quantum dot nanocrystal surfaces includes the multi-valent cations becoming attached to the QD nanocrystal surfaces through pseudo-atomic layer deposition.

10. The method of claim 1 wherein forming the treated quantum dots emitting the non-varying intensity of first wavelength of light when subjected to a continuous exposure of the second wavelength of light includes the treated QDs emitting light selected from the group consisting of blue, green, and red color light when exposed to light in the ultraviolet (UV) spectrum.

11. The method of claim 1 wherein forming the treated quantum dots emitting the non-varying intensity of first wavelength of light when subjected to a continuous exposure of the second wavelength of light includes the treated QDs emitting a light color selected from the group consisting of red and green when exposed to a blue color light.

12. A method for forming a light emitting diode device with suppressed quantum dot photobrightening, the method comprising:
providing quantum dot (QD) nanocrystals having a surface, with a maximum cross-sectional dimension of 10 nanometers (nm), capable of emissions in the visible spectrum of light;
treating the quantum dot nanocrystal surfaces with a solution including a multi-valent cation salt;
heating the solution to a temperature in a range of 50 to 200 degrees C.;
in response to heating the solution, attaching elements to the surface of the quantum dot nanocrystals consisting of cations, to formed treated QDs with suppressed photobrightening;
depositing the treated QDs overlying a top surface of a light emitting diode (LED); and,
forming an LED device emitting a non-varying intensity of a first wavelength light in the visible spectrum from the treated QDs when subjected to a continuous exposure of a second wavelength of LED light having an intensity of greater than 50 watts per square centimeter (W/cm$^2$).

13. The method of claim 12 wherein providing the QD nanocrystals includes providing QD nanocrystals with a structure selected from the group consisting of a solitary core and core-single shell structure.

14. The method of claim 12 wherein providing the QD nanocrystals includes providing QD nanocrystals comprising a binary or binary alloyed material surface; and,
wherein treating the QD nanocrystals with the solution includes treating the QD nanocrystal surface with a solution including divalent cation salts.

15. The method of claim 14 wherein the QD nanocrystal surface is selected from the group consisting of CdS, CdSe, CdTe, GaAs, InAs, InN, InP, ZnS, ZnSe, ZnTe, and combinations thereof.

16. The method of claim 12 wherein providing the QD nanocrystal includes providing QD nanocrystals with a tertiary or tertiary alloyed material surface; and,
wherein treating the QD nanocrystals with the solution includes treating the QD nanocrystal surfaces with a solution including a material selected from the group consisting of trivalent cation salts, divalent cation salts, monovalent cation salts, and combinations thereof.

17. The method of claim 16 wherein the QD nanocrystal surface is selected from the group consisting of ZnSSe, ZnSeTe, ZnSTe, CdSSe, CdSeTe, CdSTe, ZnCdS, ZnCdSe, ZnCdTe, ZnCdSSe, ZnCdSeTe, InGaAs, GaAlAs, InGaN, CuInS$_2$, CuGaS$_2$, Cu(In,Ga)Se$_2$, Cu(Zn,Sn)Se$_2$, Cu(Zn,Sn)S$_2$, CuIn(Se,S)$_2$, CuZn(Se,S)$_2$, CuSn(Se,S)$_2$, Cu(Zn,Sn)(Se,S)$_2$, and combinations thereof.

18. The method of claim 12 wherein providing the QD nanocrystals includes providing QD nanocrystals having a Type III-V semiconductor surface; and,
wherein treating the QD nanocrystals with the solution includes treating the QD nanocrystal surfaces with a solution including a material selected from the group consisting of trivalent cation salts, divalent cation salts, and combinations thereof.

19. The method of claim 18 wherein the trivalent cation salts include a material selected from the group consisting of Al, Ga, In, Fe, Sb, and Bi.

20. The method of claim 12 wherein attaching multi-valent cations to the surface of the quantum dot nanocrystals includes the multi-valent cations becoming attached to the QD nanocrystal surfaces through pseudo-atomic layer deposition.

21. The method of claim 12 further comprising:
prior to depositing the treated QDs overlying the top surface of the LED, mixing the treated QDs with a matrix material selected from the group consisting of epoxy, silicon, and acrylate based polymers to form a matrix paste; and,
wherein depositing the treated QDs overlying the top surface of the LED includes depositing the matrix paste.

22. The method of claim 12 wherein forming the LED device emitting the non-varying intensity of the first wavelength light from the treated QDs when subjected to the continuous exposure of the second wavelength of LED light includes the treated QDs emitting a non-varying intensity of light selected from the group consisting of blue, green, and red color light when exposed to LED light in the ultraviolet (UV) spectrum.

23. The method of claim 12 wherein forming the LED device emitting the non-varying intensity of the first wavelength light from the treated QDs when subjected to the continuous exposure of the second wavelength of LED light includes the treated QDs emitting a non-varying intensity of light color selected from the group consisting of red and green when exposed to a blue color LED light.

* * * * *